United States Patent [19]
Koon

[11] Patent Number: 5,985,123
[45] Date of Patent: Nov. 16, 1999

[54] CONTINUOUS VERTICAL PLATING SYSTEM AND METHOD OF PLATING

[76] Inventor: Kam Kwan Koon, 21, Breamar Hill Road, Block 21, 13 Floor, Room B, Breamar Hill Mansions, North Point, The Hong Kong Special Administrative Region of the People's Republic of China

[21] Appl. No.: 08/891,406

[22] Filed: Jul. 9, 1997

[51] Int. Cl.$^6$ .............................. C25D 5/00; C25D 17/00
[52] U.S. Cl. ..................... 205/96; 204/198; 204/230.3; 204/276; 204/DIG. 7; 205/99
[58] Field of Search ................................. 205/96, 97, 99; 204/228, DIG. 7, 198, 202, 205, 275, 276, 230.3

[56] References Cited

U.S. PATENT DOCUMENTS

| | | | |
|---|---|---|---|
| 3,692,639 | 9/1972 | Delmousos | 205/96 |
| 3,862,891 | 1/1975 | Smith | 205/96 |
| 3,963,588 | 6/1976 | Glenn | 205/96 |
| 4,534,832 | 8/1985 | Doiron, Jr. | 205/96 |
| 4,828,654 | 5/1989 | Reed | 205/97 |
| 5,236,566 | 8/1993 | Tsuchiya et al. | 204/206 |
| 5,429,738 | 7/1995 | Beyerle et al. | 205/125 |
| 5,441,619 | 8/1995 | Kawachi et al. | 204/206 |
| 5,516,412 | 5/1996 | Andricacos et al. | 204/224 R |
| 5,597,460 | 1/1997 | Reynolds | 204/212 |
| 5,597,469 | 1/1997 | Carey et al. | 205/118 |
| 5,702,583 | 12/1997 | Rischke et al. | 205/82 |
| 5,776,327 | 7/1998 | Botts et al. | 205/96 |

*Primary Examiner*—Kathryn Gorgos
*Assistant Examiner*—William T. Leader
*Attorney, Agent, or Firm*—Dilworth & Barrese

[57] ABSTRACT

An electroplating apparatus comprising: an electroplating tank assembly for receiving an electroplating solution; transfer structure for transferring a substrate to be electroplated along a transfer passage within the electroplating tank assembly; at least one pair of sparger assemblies for dispersing the electroplating solution in the direction of the substrate; at least one pair of anode baskets for containing anode material; electricity feeding circuitry for feeding electricity to the anode material contained in the at least one pair of anode baskets; and at least one pair of anode shield assemblies positioned to direct a current flux toward the substrate to provide for a uniform distribution of plating material thereon.

11 Claims, 3 Drawing Sheets

CONTINUOUS VERTICAL PLATING SYSTEM AND METHOD OF PLATING

BACKGROUND OF THE INVENTION

1. Field of the Invention

The present invention relates to an electroplating apparatus and system, and more particularly to a continuous vertical electroplating apparatus and system.

2. Description of the Related Art

Electroplating is a common process for depositing a thin film of metal or alloy on a substrate such as, for example, a variety of electronic components. In a typical electroplating apparatus or system, the substrate is placed in a suitable electrolyte bath containing ions of a metal to be deposited. The substrate is connected to the negative terminal of a power supply to form a cathode, and a suitable anode is connected to the positive terminal of the power supply. Electrical current flows between the anode and cathode through the electrolyte, and metal is deposited on the substrate by an electrochemical reaction.

In many electronic components it is desirable to deposit the metal film with a uniform thickness across the substrate and with uniformity of composition. However, the electroplating process is relatively complex and various naturally occurring forces may degrade the electroplating process. Most significantly, the electrical current or flux path between the anode and the cathode should be relatively uniform without undesirable spreading or curving to ensure uniform electrodeposition. Furthermore, as metal ions are depleted from the electrolyte, the uniformity of the electrolyte is decreased and must be suitably corrected to avoid degradation of the electroplating process. Additionally, debris and waste particles are generated in the chemical reactions which can degrade the metal film on the substrate upon settling thereon.

Conventional electroplating equipment includes various configurations for addressing these as well as other problems for ensuring relatively uniform electroplating. Suitable circulation of the electrolyte is required for promoting electroplating uniformity, and care is required for properly aligning the cathode and anode to reduce undesirable flux spreading. For example, one type of conventional electroplating apparatus mounts the cathode at the bottom of an electrolyte bathing cell, with the anode being spaced above and parallel to the cathode. Since the substrate is at a common depth in the cell, the electroplating process is less susceptible to vertically occurring variations in the process due to buoyancy or gravity effects or other convection effects occurring during the process. For example, ion depletion in the electrolyte adjacent to the substrate will create local currents which will have a common effect along the horizontal extent of the substrate, but can vary vertically.

Although horizontally positioned cathodic substrates typically result in relatively uniform electrodeposition, the substrates are more prone to the settling thereon of debris particles which degrade the substrate. Also, the various conventional configurations for horizontally electroplating a substrate have varying degrees of complexity which increases the difficulty in mass producing electrodeposition articles. It is desirable to provide not only high uniform thickness and composition in an electrodeposition substrate, but also do so in an apparatus capable of high-volume continuous manufacturing rather than conventional batch systems, and preferably using automated handling equipment.

Thus, it would be desirable to provide a vertical electroplating apparatus and method which allows for a continuous mass-production electroplating process and overcomes the problems associated with conventional electroplating systems. However, a problem that exists with the conventional vertical electroplating apparatus and systems is that the electroplating material is not uniformly distributed on the surface of the substrate to be electroplated, especially in systems attempting to electroplate substrates of varying sizes wherein the length of the anode does not correspond to the length of the substrate. Typically, when the length of the anode does not correspond to the length of the substrate, non-uniform distribution of the plating material occurs with the majority of the coating being concentrated on a particular portion of the substrate. It is inefficient to require the operator of the apparatus to continuously change the size of the anode to match the length of the substrate. Moreover, the anode plates utilized in the conventional electroplating apparatus are often limited to a predetermined size. Therefore, it is substantially impossible to vary an area of the anode depending on the size of a substrate to be electroplated. Thus, an increase in area of the anode relative to the substrate causes a coating thickness on the substrate to be excessively increased at a particular portion and excessively decreased at another portion thereof. This leads to a failure in the formation of a film having a satisfactory uniform thickness which is required on the substrate, thereby resulting in a failure to provide a substrate with satisfactory quality.

Thus, a need exists for a continuous vertical plating apparatus and system which overcomes the problems associated with the prior art (e.g., non-uniform distribution of plating material due to varying substrate sizes, and substrates shifting out of vertical alignment.

SUMMARY OF THE INVENTION

It is an object of the present invention to provide an electroplating apparatus comprising: an electroplating tank assembly for receiving an electroplating solution; transfer means for transferring a substrate to be electroplated along a transfer passage within the electroplating tank assembly; at least one pair of sparger assemblies for dispersing the electroplating solution toward the substrate; at least one pair of anode baskets for containing anode material; electricity feeding means for feeding electricity to the anode material contained in the at least one pair of anode baskets; electrical connection means for electrically connecting the substrate to the electricity feeding means; and a pair of anode shields positioned to direct a current flux toward the substrate to provide for a uniform distribution of plating material thereon.

It is another object of the present invention to provide a method for electroplating a substrate comprising the steps of: transferring a substrate to be electroplated along a transfer passage within an electroplating tank assembly containing an electroplating solution; dispersing the electroplating solution toward the substrate from at least one pair of sparger assemblies; feeding electricity to anode material contained in at least one pair of anode baskets; electrically connecting the substrate to the electricity feeding means; and directing a current flux via a pair of anode shields toward the substrate to provide for a uniform distribution of plating material on the surfaces of the substrate.

It is yet another object of the present invention to provide an electroplating apparatus and method which uniformly distributes electroplating material on substrates of varying sizes.

It is a further object of the present invention to provide an electroplating apparatus and method which maintains substrates in proper vertical alignment for uniform distribution of electroplating material.

It is still another object of the present invention to provide an electroplating apparatus and method which uniformly distributes electroplating material to substrates being transferred through an electroplating tank at different speeds.

These and other objects, features and advantages of the present invention will become apparent from the following detailed description of illustrative embodiments, which is to be read in connection with the accompanying drawings.

BRIEF DESCRIPTION OF THE DRAWINGS

For a better understanding of the invention, reference is made to the following description of exemplary embodiments thereof, and to the accompanying drawings, wherein.

DETAILED DESCRIPTION OF A PREFERRED EMBODIMENT

Figure 1:
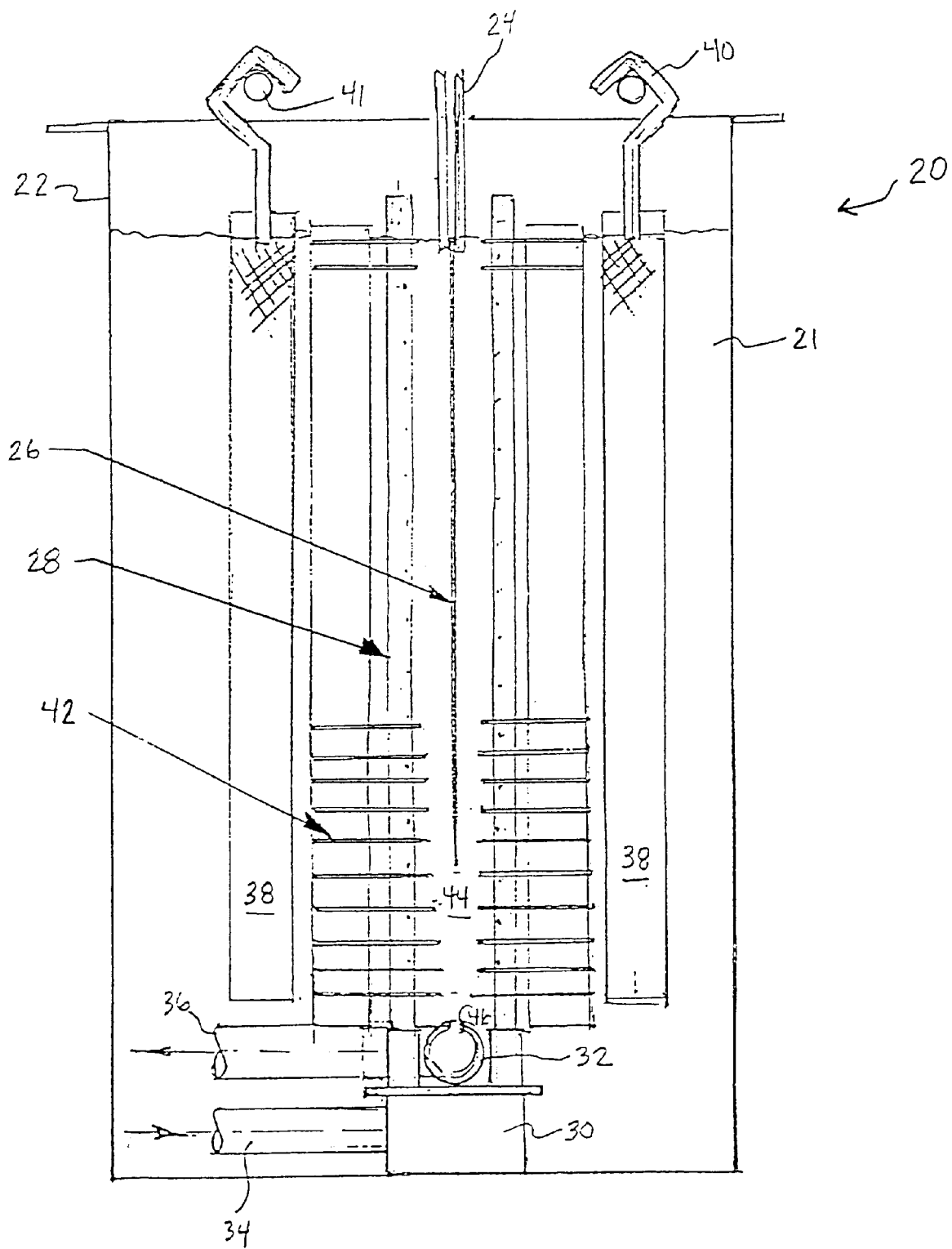
FIG. 1 is a side view of an electroplating apparatus in accordance with an embodiment of the present invention.

Referring initially to FIG. 1, an embodiment of electroplating apparatus 20 in accordance with the present invention is illustrated. Electroplating apparatus 20 comprises an electroplating tank 22 for receiving an electroplating solution 21; transfer assembly 24 for transferring a substrate 26 to be electroplated along a transfer passage 44; at least one pair of sparger assemblies, including at least one pair of sparger tubes 28, for dispersing electroplating solution 21 in the direction of substrate 26; a pair of anode baskets 38 for containing anode material; electricity feeding circuitry (not shown) for feeding electricity to the anode material contained in anode baskets 38; electrical connection circuitry (not shown) for electrically connecting substrate 26 to the electricity feeding circuitry; and a pair of anode shield assemblies 42 positioned to direct a current flux in the direction of substrate 26 in a manner which provides for a uniform distribution of plating material on substrate 26 and to maintain substrate 26 in vertical alignment as it travels through transfer passage 44.

Electroplating tank 22 comprises at least a horizontal bottom and four vertical sides, and is illustrated having a substantially rectangular geometric configuration. Other geometric configurations, such as cylindrical or elliptical configurations, may also be utilized. The purpose of electroplating tank 22 is to contain an electroplating solution 21 and provide a container region wherein the electroplating process may proceed.

Transfer assembly 24 is provided to transfer substrate 26 to be electroplated along a transfer passage 44. Transfer assembly 24 is a structure which engages a plurality of substrates and transfers the substrates through the electroplating tank along the transfer passage. Preferably, transfer assembly 24 is a conductive chain having a plurality of clips thereon at predetermined intervals. The plurality of clips typically comprise a clip body formed with a clamp section and a clamp element. The clamp element may be pivotally mounted on the clip body by means of a support shaft. The clip body may further be electrically connected to the endless conductive chain so that the clip body and clamp element are electrically connected through the conductive chain to the cathode terminal of the electricity feeding circuitry.

The sparger assembly comprises electroplating solution inlet piping 34, a sparger tube inlet header 30, at least one pair of vertical sparger tubes 28, an outlet header 32 and electroplating solution outlet piping 36. During operation, the electroplating solution 21 flows through inlet piping 34 (e.g., via pumping means) and into inlet header 30 where it is then distributed among the at least one pair of vertical sparger tubes 28. Electroplating solution 21 is then discharged out of a plurality of holes formed at predetermined locations along the longitudinal axis of sparger tubes 28, in the direction of substrate 26. Advantageously, vertical sparger tubes 28 are designed having a plurality of holes along their vertical axis to vigorously agitate electroplating solution 21 at the surfaces of substrate 26. It is known that enhanced uniformity of metal deposition is promoted by suitable agitation of the electroplating solution. Agitation facilitates increased current flux density which will facilitate uniform distribution of electroplating material at different substrate transfer speeds. Additionally, the fluid force produced by the flow of electroplating solution 21 from vertical sparger tubes 28 advantageously maintains substrate 26 in vertical alignment at a position equidistant from the pair of anode shield assemblies 42, as substrate 26 is transferred along transfer passage 44.

As electroplating solution 21 is utilized to deposit ions on the surface of substrate 26, sediment and waste material are produced in the solution. Outlet header 32 is advantageously configured to facilitate collection of the sediment and waste material from electroplating solution 21. Outlet header 32 is located in a lower portion of tank 22 and includes at least one void in an upper portion of the header such that the sediment and waste material will be collected therein for removal through solution outlet piping 36. Prior to being returned to the spargers, electroplating solution 21 is circulated through a filter system to remove the unwanted sediment and waste material.

Anode baskets 38 are provided to contain suitable anode material for the substrate being electroplated. As illustrated in FIG. 1, anode baskets 38 may be supported by a hanger assembly 40 engaging support rails 41. At least one pair of anode baskets 38 are submerged vertically, with respect to the horizontal bottom of tank 22, within electroplating solution 21 in tank 22, and are positioned adjacent the side walls of the tank to provide ample space between the anode baskets to position anode shield assemblies 42, sparger tubes 28 and transfer passage 44.

The anodes arranged within anode baskets 38 are electrically connected to electricity feeding circuitry (not shown), as is known to one having ordinary skill in the art. The electricity feeding circuitry typically comprises rectifiers which are adapted to provide a voltage and a current which are sufficient to permit desired electroplating to be carried out. The rectifiers are connected, at an anode terminal thereof, to the anodes in each pair of anode baskets 38. Cathodes of the rectifiers are commonly connected to a feed contact through which the substrate being transferred is fed with electricity.

Figure 3:
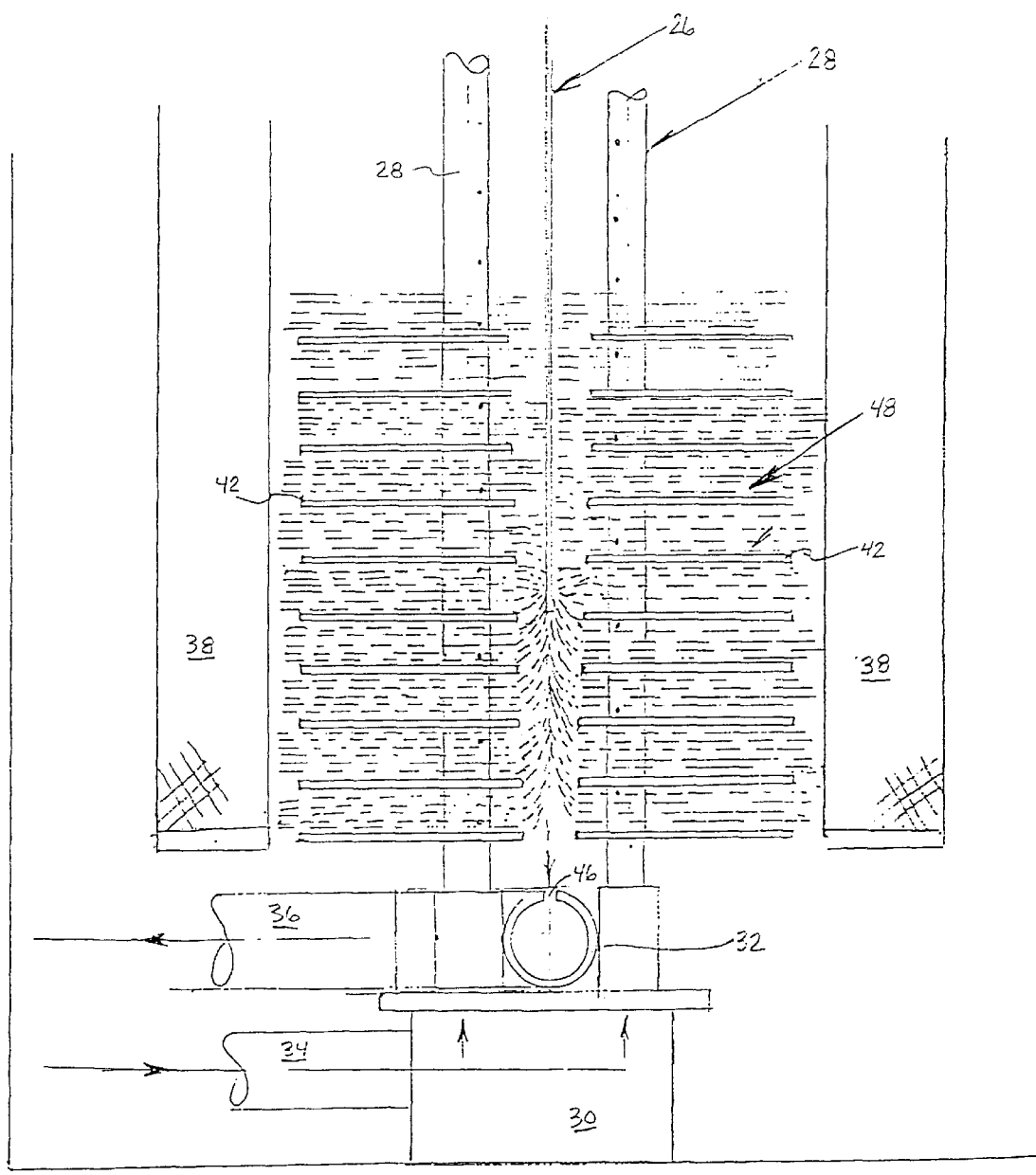
FIG. 3 is a detail view of the elements of the electroplating apparatus illustrated in FIG. 1.

A pair of anode shield assemblies 42, each assembly comprising a plurality of individual, substantially rectangular elongate anode shield elements, are interposed the pair of anode baskets 38 and configured to evenly distribute the current flux emitted from the anodes toward substrate 26. The elongate elements are substantially evenly distributed vertically and positioned parallel to the path of current flux 48. As best seen in FIG. 3, by virtue of the opposing electric charges placed on the anodes and the substrate, electric current flux 48, indicated by the dashed lines, flows through the electroplating solution from the anodes toward substrate 26. The formation of a film or coating of electroplating material on substrate 26 is a function of the quantity of current flux 48 impinging upon the surface of the substrate. Therefore, in order to achieve a uniform coating on the surface of substrate 26, the current flux 48 must be uniformly distributed. The physical configuration of anode shield assemblies 42 will cause current flux 48 to be uniformly distributed along the length of substrate 26, thereby eliminating localized areas of disproportionately increased or decreased coating.

As discussed above, a problem often encountered in the art is a mismatch between the length of the substrate and the length of the anode. In conventional electroplating systems, the mismatch will exacerbate the problem of non-uniform coating thickness. As seen in FIG. 3, in accordance with the present invention, excess current flux 48 will be directed solely to the bottom portion of substrate 26, to maximize the substrate surface area that will have a uniform coating thickness. Advantageously, any excessive coating accumulation will be isolated to the lower portion of substrate 26 rather than a random non-uniform thickness across the entire surface. Isolating excessive accumulation to the lower portion of substrate 26 will result in a much greater yield of substrate material. Thus, a continuous vertical electroplating apparatus is disclosed which is able to efficiently electroplate a plurality of substrates having different lengths without requiring an operator to change the length of the anodes.

The plurality of anode shield assembly elements are preferably formed of a polyvinylchloride material.

Looking at the plurality of anode shield elements in their longitudinal direction, as illustrated in FIGS. 1 and 3, it is apparent that the elements form a longitudinal transfer passage 44 through which substrate 26 is transferred. The distance between each of the individual elements may vary. In a preferred embodiment, the distance between the lowest two elements is preferably in the range of about 0.25 inches to about one inch. The distance between the individual elements thereafter preferably increases proceeding from the lowest two elements towards the upper end of the pair of anode shields. Thus, the plurality of anode shield elements form a passage having a finite width which will perform the function of guiding substrate 26 in a substantially vertical manner through transfer passage 44. It is preferred that the distance between the elements increases from the lower portion to the upper portion to ensure that substrate 26 is guided at its lower portion. Therefore, any potential damage to the substrate due to the rubbing against the elements will be restricted to the lower portion.

Figure 2:
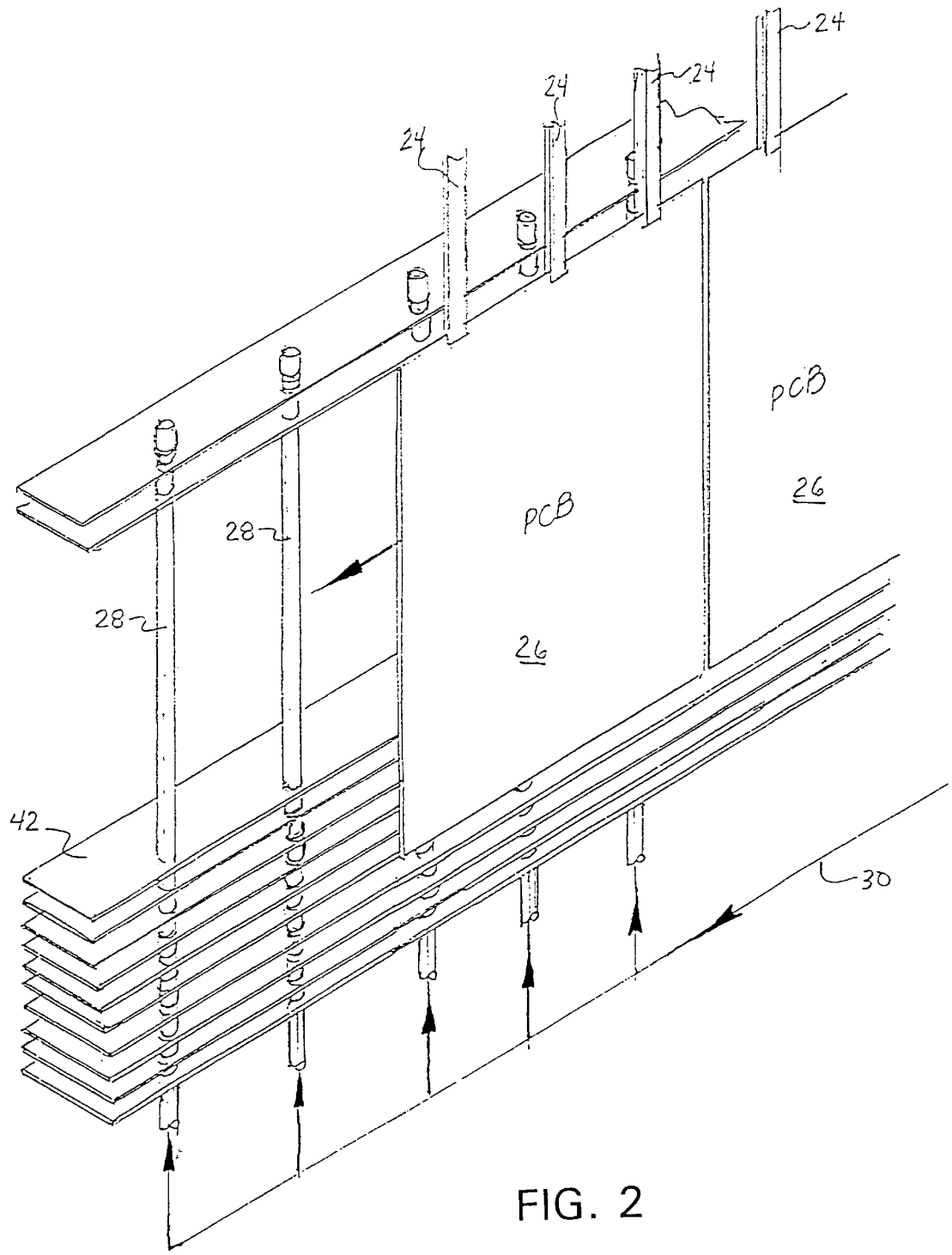
FIG. 2 is a partial perspective view of the electroplating apparatus illustrated in FIG. 1.

FIG. 2 illustrates a partial perspective view of at least one substrate 26 being transferred through an electroplating apparatus in accordance with the present invention, via transfer assembly 24. For illustrative purposes, substrate 26 is shown as a printed circuit board. However, it is contemplated that the presently disclosed apparatus and system may be used for electroplating a variety of other substrate materials.

Inlet header 30 is schematically illustrated supplying electroplating solution 21 to a plurality of sparger tubes 28. Although shown as a plurality of individual sparger tubes, alternative embodiments of sparger assemblies are contemplated. For example, a sparger may be provided in the form of a panel as disclosed in U.S. Pat. No. 5,597,469 to Carey et al., the disclosure therein is incorporated by reference herein.

Although the illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. An electroplating apparatus comprising:
    an electroplating tank configured to receive an electroplating solution, the electroplating tank having a top and a bottom;
    transfer assembly for transferring a substrate to be electroplated along a transfer passage within said electroplating tank assembly;
    at least two sparger assemblies, each sparger assembly having a substantially vertical longitudinal axis and being positioned to disperse said electroplating solution in the direction of said substrate, one of said at least two sparger assemblies being located on each side of said transfer passage;
    at least one pair of anode baskets for containing anode material;
    electricity feeding means for feeding electricity to said anode material contained in said at least one pair of anode baskets;
    at least one pair of anode shield assemblies positioned to direct current flux toward said substrate in a manner which provides for a uniform distribution of plating material on said substrate, each anode shield assembly being positioned between one of said pair of anode baskets and said transfer passage, wherein one anode shield assembly is positioned on one side of said transfer passage and the other of said anode shield assemblies is positioned on the other side of said transfer passage opposite the anode shield assembly on said one side, each anode shield assembly including a plurality of horizontally disposed plate members, each plate member being spaced vertically from adjacent plate members of the anode shield assembly, wherein the distance between the plate members on one side of said transfer passage and the plate members on the other side of said transfer passage converges from the top of the electroplating tank to the bottom of the electroplating tank.

2. An electroplating apparatus as recited in claim 1, wherein said at least one pair of anode baskets is positioned substantially orthogonal to a bottom of said tank, within said at least one electroplating tank on either side of said at least one pair of anode shield assemblies.

3. An electroplating apparatus as recited in claim 1, wherein said electroplating apparatus is adapted to plate a substrate which is a printed circuit board.

4. An electroplating apparatus as recited in claim 1, wherein said substrate is held in a vertical position substantially orthogonal to a bottom of said electroplating tank by said transfer assembly.

5. An electroplating apparatus as recited in claim 1, wherein said at least one pair of anode shield assemblies is formed of polyvinylchloride material.

6. An electroplating apparatus as recited in claim 1, wherein said at least one pair of sparger assemblies includes means for recirculating said electroplating solution.

7. An electroplating apparatus as recited in claim 6, wherein said means for recirculating said electroplating solution includes means for filtering sediment and waste material from said electroplating solution.

8. An electroplating apparatus as recited in claim 1, wherein said sparger assemblies include vertical sections having holes therein for dispersing said electroplating solution.

9. A method for electroplating a substrate comprising the steps of:

transferring a substrate to be electroplated along a transfer passage within an electroplating tank containing an electroplating solution, the electroplating tank having a top and a bottom;

dispersing said electroplating solution toward said substrate from at least one pair of sparger assemblies;

feeding electricity to anode material contained in at least one pair of anode baskets;

electrically connecting said substrate to said electricity feeding means;

providing at least one pair of an ode shield assemblies, each anode shield assembly including a plurality of horizontally disposed plate members, each plate member being vertically spaced from adjacent plate members of the anode shield assembly;

positioning one of said pair of anode shield assemblies on one side of said transfer passage and the other of said pair of anode shield assemblies on an opposite side of said transfer passage such that the plate members are substantially perpendicular to the substrate and the distance between the plate members on the one side of said transfer passage and the plate members on the other side of said transfer passage converges from the top of the electroplating tank to the bottom of the electroplating tank; and directing a current flux via said at least one pair of anode shield assemblies toward said substrate to provide uniform distribution of plating material on at least one surface of said substrate.

10. A method for electroplating a substrate as recited in claim 9, further comprising the step of recirculating said electroplating solution.

11. A method for electroplating a substrate as recited in claim 10, wherein said recirculating step includes a step of filtering sediment and waste material from said electroplating solution.

* * * * *